(12) United States Patent
Wang et al.

(10) Patent No.: US 10,510,796 B1
(45) Date of Patent: Dec. 17, 2019

(54) SMALL PIXELS HAVING DUAL CONVERSION GAIN PROVIDING HIGH DYNAMIC RANGE

(71) Applicant: OmniVision Technologies, Inc., Santa Clara, CA (US)

(72) Inventors: Rui Wang, San Jose, CA (US); Zheng Yang, San Jose, CA (US); Hiroaki Ebihara, San Jose, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/008,434

(22) Filed: Jun. 14, 2018

(51) Int. Cl.
*H01L 27/146* (2006.01)
*H04N 5/355* (2011.01)

(52) U.S. Cl.
CPC .. *H01L 27/14641* (2013.01); *H01L 27/14634* (2013.01); *H01L 27/14643* (2013.01); *H04N 5/3559* (2013.01)

(58) Field of Classification Search
CPC ......... H01L 27/14641; H01L 27/14643; H01L 27/14634; H04N 5/3559
USPC ....... 257/291, 292, 233, 316, 359, 432, 444, 257/E27.13, E27.131, E27.132, E27.133, 257/E27.139, E31.127; 348/57, 59, 69, 348/73, 78, 400, E3.018, E3.017, E3.019, 348/E3.029; 438/57, 59, 69, 73, 78, 400
See application file for complete search history.

(56) References Cited

U.S. PATENT DOCUMENTS

| | | | |
|---|---|---|---|
| 7,432,540 B2 * | 10/2008 | McKee | H01L 27/14603 250/208.1 |
| 7,728,896 B2 | 6/2010 | McKee | |
| 8,264,579 B2 * | 9/2012 | Paik | H01L 27/14603 250/208.1 |
| 8,686,339 B2 | 4/2014 | Mabuchi | |
| 9,041,838 B2 | 5/2015 | Bechtel et al. | |
| 9,357,148 B2 * | 5/2016 | Itonaga | H01L 27/14603 |
| 9,888,191 B2 * | 2/2018 | Beck | H04N 5/243 |
| 9,911,773 B2 | 3/2018 | Yang et al. | |
| 2007/0035649 A1 * | 2/2007 | McKee | H01L 27/14609 348/308 |
| 2012/0256077 A1 * | 10/2012 | Yen | H01L 27/14609 250/208.1 |

* cited by examiner

*Primary Examiner* — Dao H Nguyen

(57) ABSTRACT

A group of shared pixels comprises: a first shared pixel comprising a first photodiode and a first transfer gate; a second shared pixel comprising a second photodiode and a second transfer gate; a third shared pixel comprising a third photodiode and a third transfer gate; a fourth shared pixel comprising a fourth photodiode and a first transfer gate; a first floating diffusion shared by the first shared pixel and the second shared pixel; a second floating diffusion shared by the third shared pixel and the fourth shared pixel; a capacitor coupled to the first floating diffusion through a first dual conversion gain transistor, and the second floating diffusion through a second dual conversion gain transistor; wherein the capacitor is formed in an area covering most of the first shared pixel, the second shared pixel, the third shared pixel, and the fourth shared pixel.

16 Claims, 7 Drawing Sheets

SMALL PIXELS HAVING DUAL CONVERSION GAIN PROVIDING HIGH DYNAMIC RANGE

FIELD OF THE INVENTION

This invention relates to dual conversion gain (DCG), and more specifically relates to small pixels having dual conversion gain (DCG) providing high dynamic range (HDR).

BACKGROUND OF THE INVENTION

Recently, camera modules are mounted on smart phones, automobiles, medical devices, and so on. With the developments of technology, the resolution of the camera increases, while the size of the camera reduces significantly. The camera modules are manufactured by using typically complementary metal oxide semiconductor (CMOS) image sensors. A CMOS image sensor comprises a plurality of pixels.

Standard image sensors have a limited dynamic range of approximately 60 to 70 dB. However, the luminance dynamic range of the real world is much larger. Natural scenes often span a range of 90 dB and over. In order to capture the highlights and shadows simultaneously, high dynamic range (HDR) technologies have been used in image sensors to increase the captured dynamic range. A technique to increase dynamic range is to merge two exposures captured with standard (low dynamic range) image sensors into a single linear HDR image, which has much larger dynamic range than a single exposure image.

The two exposures may be captured using two different gains known as dual conversion gain (DCG). DCG includes high conversion gain (HCG) and low conversion gain (LCG). LCG may be provided by an added capacitor in the pixel circuit. The area of the capacitor is limited due to the small pixel size. Thus its capacitance is also limited. This in turn limits the dynamic range. Accordingly, a higher dynamic range is demanded, while the size of the capacitor is unchanged.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
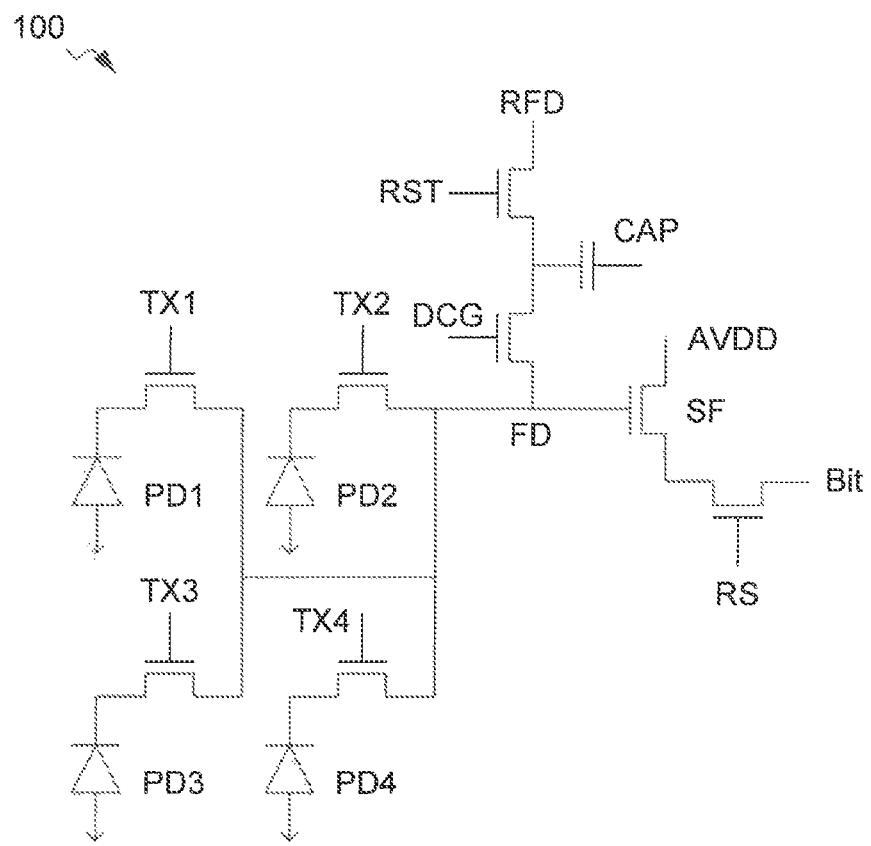
FIG. 1 shows a HDR group of 2×2 shared pixels.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

In some high resolution CMOS image sensor designs, a group of four pixels may share a floating diffusion (FD). Comparing to non-shared pixels, the obvious advantage is that less readout circuit is required in the pixel array, so that the pixel size can be reduced.

FIG. 1 shows a HDR group of 2×2 shared pixels 100 comprising four photodiodes, PD1, PD2, PD3, and PD4 coupled to a single FD through four transfer gate transistors, TX1, TX2, TX3, and TX4, respectively. To read charges accumulated in a photodiode (e.g., PD1), only one transfer gate is turned on (e.g., TX1). Accordingly, only charges from the photodiode (e.g., PD1) are transferred to FD. The charges in FD are converted to a voltage by a source follower transistor (SF). An output signal Bit of SF is readout by turning on a row select transistor (RS) coupled to the source of SF. The drain of SF is coupled to analog power supply AVDD (analog voltage drain drain). To read charges accumulated in another photodiode (e.g., PD2), another transfer gate is turned on (e.g., TX2), and so forth.

In some HDR CMOS image sensor designs, a dual conversion gain transistor (DCG) and a capacitor (CAP) may be added in group of 2×2 shared pixels 100. FD is coupled to a reset transistor (RST) through DCG. FD may be reset to a floating diffusion reset voltage via power supply RFD (reset FD).

FIG. 1 shows that DCG and CAP are added in the pixel circuit. When DCG is turned on, FD is coupled to CAP. Accordingly, transferred charges from a photodiode can be accommodated in a larger capacity, which is the sum of capacitance of FD (CFD) and CAP. CFD may include capacitance of SF gate, capacitance of DCG source, capacitance of TX overlap, and metal coupling capacitance, in addition to the FD p-n junction capacitance.

This results in a low conversion gain (LCG). Because the output voltage of SF is limited by AVDD, so the larger capacitance (CFD+CAP) results in the smaller conversion gain to accommodate the conversion of more charges to voltage in a limited voltage range. LCG is inversely proportional to (CFD+CAP).

When the conversion gain is low, the charges of low light pixels may not be differentiated from random noise, due to the smaller converted voltage signal compared to random noise, thus the dynamic range is reduced. Thus for low light, DCG is turned off disconnecting CAP from FD. Accordingly, transferred charges from the photodiode may be accommodated in a smaller capacity, which is CFD alone without CAP. This results in a high conversion gain (HCG). The smaller capacitance results in the larger conversion gain to accommodate the conversion of less charges to voltage in a limited voltage range. HCG is inversely proportional to CFD.

Dynamic range (DR) may be proportional to HCG/LCG or (CFD+CAP)/CFD. In order to get a high DR, (CFD+CAP) must be large and CFD must be small. To get (CFD+CAP) large, one needs more sharing photodiodes to make CFD large and larger area to make CAP large. On the other hand, one needs less sharing photodiodes to make CFD small.

Figure 2:
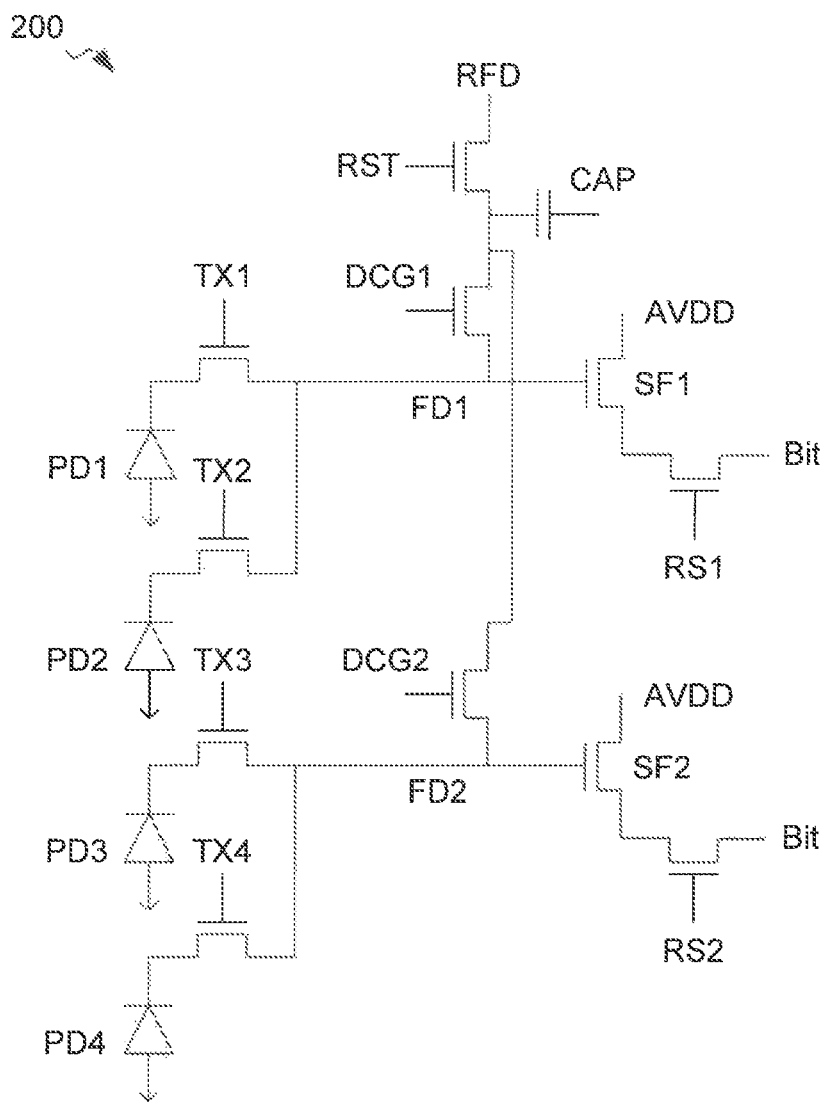
FIG. 2 shows a HDR group of two 1×2 shared pixels, according to an embodiment of the invention.

FIG. 2 shows a HDR group of two 1×2 shared pixels 200, according to an embodiment of the invention. The difference of group of two 1×2 shared pixels 200 from group of 2×2 shared pixels 100 will be described in the following. However, the common parts of group of two 1×2 shared pixels 200 and group of 2×2 shared pixels 100 may not be repeated. Group of two 1×2 shared pixels 200 comprises PD1 and PD2 coupled to FD1 through TX1 and TX2, respectively. Group of two 1×2 shared pixels 200 also comprises PD3 and PD4 coupled to FD2 through TX3 and TX4, respectively.

For HCG, both DCG1 and DCG2 are turned off. In this situation, for a pixel of group of two 1×2 shared pixels 200, CFD of the pixel is smaller than CFD of a pixel of group of 2×2 shared pixels 100, since less photodiodes shared a FD. Two pixels share a FD as compared with four pixels share a FD. Referring to that CFD may include capacitance of SF gate, capacitance of DCG source, capacitance of TX overlap, and metal coupling capacitance, less photodiodes sharing a FD results in less CFD. In this manner, CFD may include less capacitance of SF gate, TX overlap, and metal coupling.

The four photodiodes (PD1, PD2, PD3, and PD4) of group of two 1×2 shared pixels 200 share a capacitor CAP, which is the same as the shared capacitor CAP in group of 2×2 shared pixels 100.

For LCG, both DCG1 and DCG2 are turned on. In this situation, for a pixel of group of two 1×2 shared pixels 200, CFD of the pixel is larger than CFD of a pixel of group of 2×2 shared pixels 100, since the CDF of the pixel of group of two 1×2 shared pixels 200 includes 2FD, and the CDF of the pixel of group of 2×2 shared pixels 100 includes only one FD.

The capacitor CAP of group of two 1×2 shared pixels 200 has the same capacitance as that of the capacitor CAP of group of 2×2 shared pixels 100. Accordingly, the areas of the capacitors may be the same. For example, the capacitor covers most of the four shared pixels having PD1, PD2, PD3, and PD4, respectively. In this manner, the pixel size of group of two 1×2 shared pixels may be as small as that of group of 2×2 shared pixels, but the pixel of two 1×2 shared pixels may have higher dynamic range than that of group of 2×2 shared pixels.

Group of two 1×2 shared pixels 200 may comprise a first source follower SF1, which is to convert charges in FD1 to voltage and is coupled from the source to a first row select transistor RS1 to output a read signal Bit. The drain of SF1 is coupled to power supply AVDD. Similarly, a second source follower SF2, which is to convert charges in FD2 to voltage, is coupled from the source to a second row select transistor RS2 to output a read signal Bit. The drain of SF2 is coupled to power supply AVDD. A reset transistor RST resets FD1 and FD2 to RFD voltage through DCG1 and DCG2, respectively.

Figure 3:
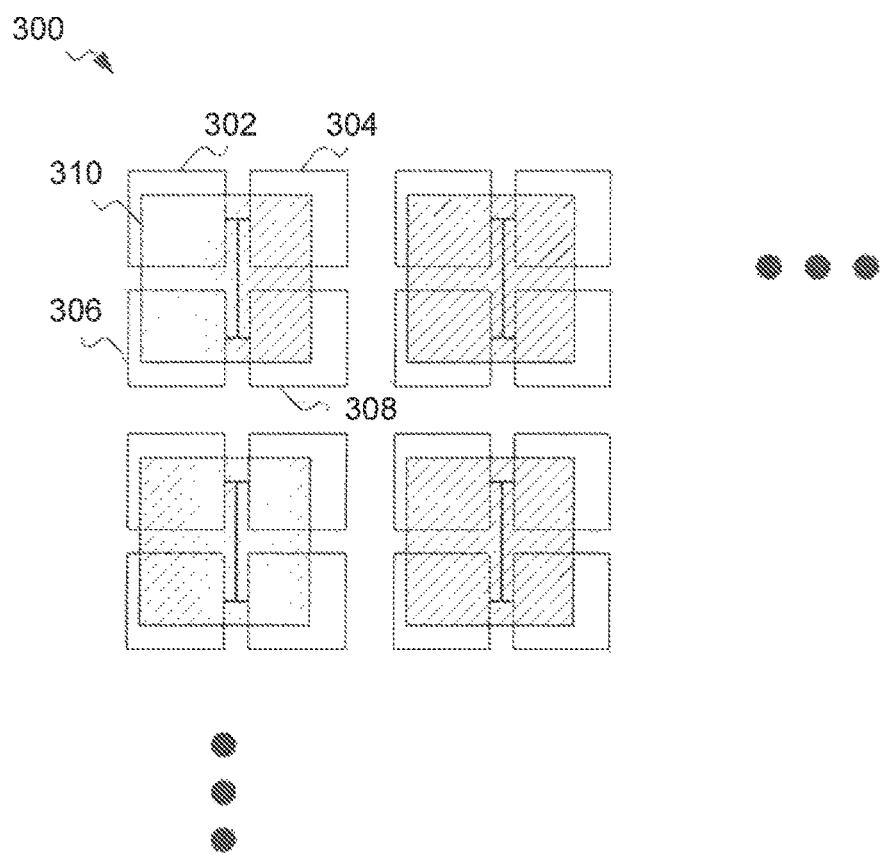
FIG. 3 shows an exemplary layout view of a pixel array of an image sensor comprising a plurality of groups of 2×2 shared pixels.

FIG. 3 shows an exemplary layout view of a pixel array of an image sensor comprising a plurality of groups of 2×2 shared pixels 300. Each group of 2×2 shared pixels comprises a first shared pixel 302, a second shared pixel 304, a third shared pixel 306, and a fourth shared pixel 308. A shared capacitor 310 is formed having an area covering most of shared pixels 302-308.

Figure 4:
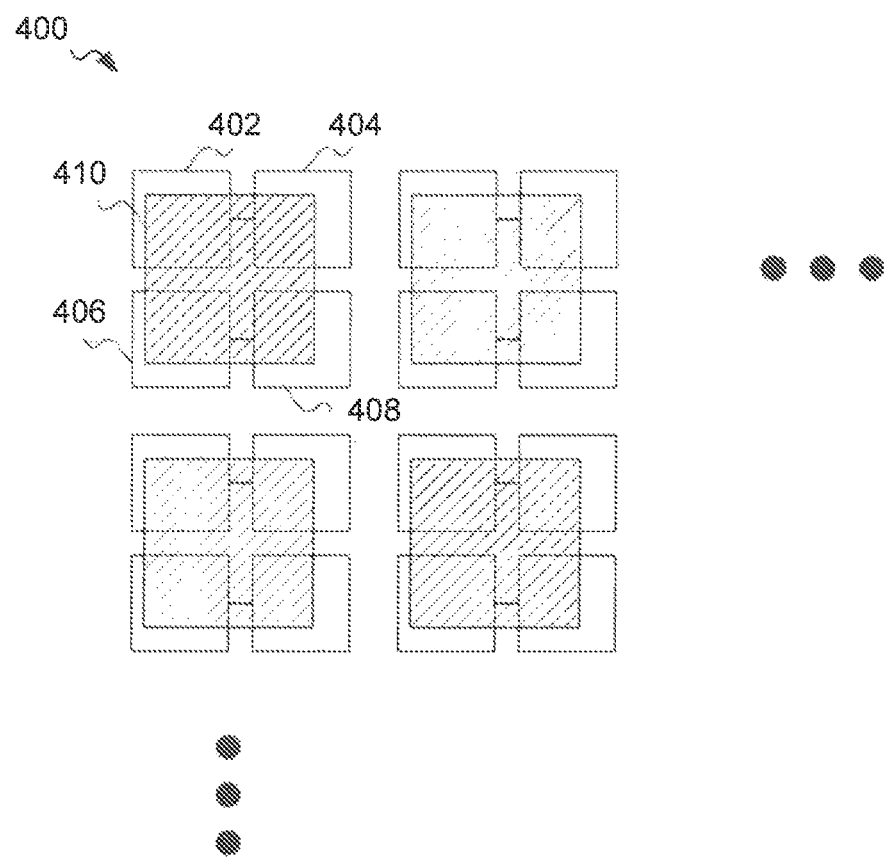
FIG. 4 shows an exemplary layout view of a pixel array of an image sensor comprising a plurality of groups of two 1×2 shared pixels, according to an embodiment of the present invention.

FIG. 4 shows an exemplary layout view of a circuit layout of a pixel array of an image sensor comprising a plurality of groups of two 1×2 shared pixels 400, according to an embodiment of the present invention. Each group of two 1×2 shared pixels comprises a first shared pixel 402, a second shared pixel 404, a third shared pixel 406, and a fourth shared pixel 408. A shared capacitor 410 is formed having an area covering part of or all shared pixels 402-408. The area may cover most of shared pixels 402-408. Capacitor 410 may comprise two parallel planar electrodes and a dielectric layer formed therebetween forming a metal-insulator-metal (MIM) type capacitor. Capacitor 410 may also comprise a planar electrode and another electrode in an oxide layer forming a metal-oxide-metal (MOM) type capacitor.

Referring to FIG. 2, first shared pixel 402 comprises a first photodiode PD1 and a first transfer gate TX1, second shared pixel 404 comprises a second photodiode PD2 and a second transfer gate TX2, third shared pixel 406 comprises a third photodiode PD3 and a third transfer gate TX3, fourth shared pixel 408 comprises a fourth photodiode PD4 and a fourth transfer gate TX4. Shared pixels 402 and 404 share FD1, RS1, and DCG1. Shared pixels 406 and 408 share FD2, RS2, and DCG2. Four shared pixels 402-408 share readout circuit including RST, RFD, AVDD, and CAP.

Figure 5:
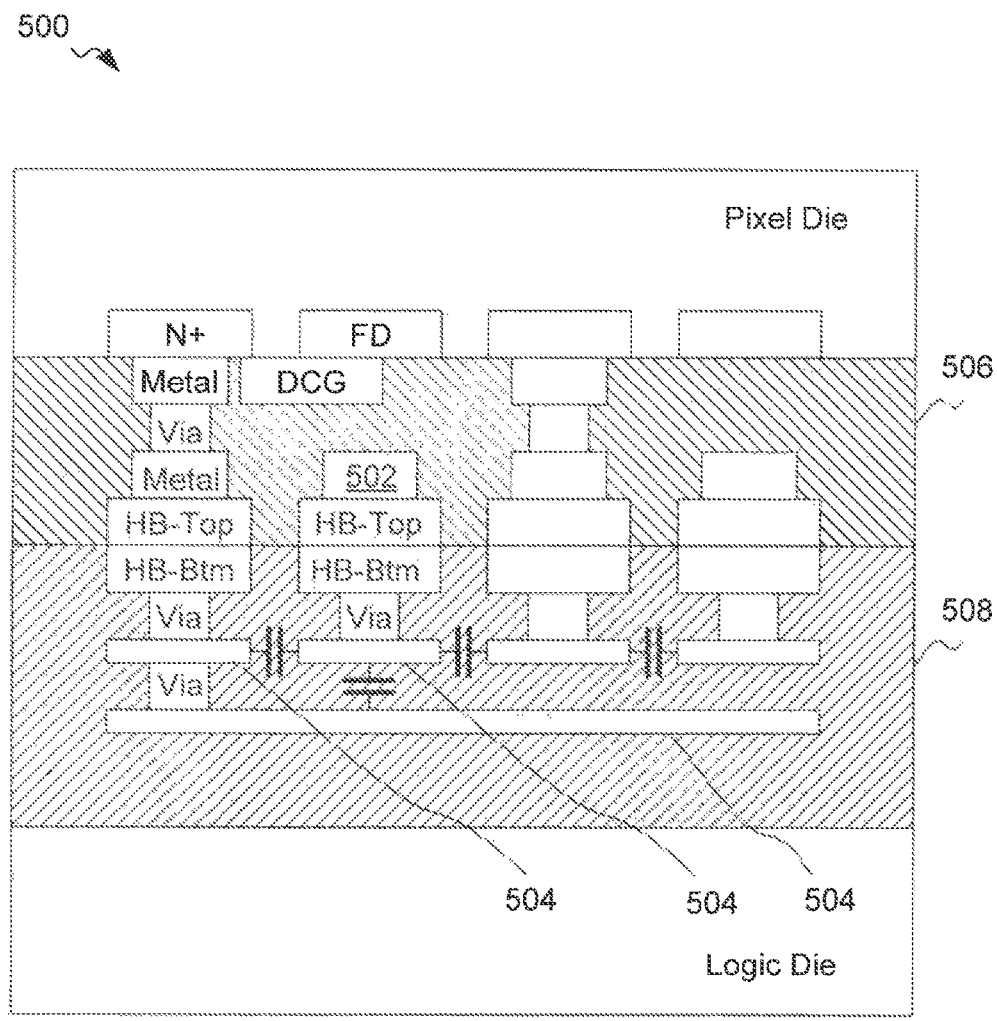
FIG. 5 shows a stacked die structure comprising a pixel die and a logic die, according to an embodiment of the invention.

Alternatively, a shared capacitor may be formed on a separate logic die in a stacked die structure as shown in FIG. 5, according to an embodiment of the present invention. An exemplary stacked die structure 500 comprises a pixel die and logic die. Pixel die comprises N+ regions and FDs. Pixel die also comprises metal layers, vias, top elements of hybrid bond (HB-Top), DCGs, and elements 502 coupled to the analog ground, embedded in an oxide layer 506 of pixel die. Logic die comprises bottom elements of hybrid bond (HB-Btm), vias, and capacitor electrodes 504, embedded in an oxide layer 508 of logic die. Two electrodes 504 form a metal-oxide-metal (MOM) type capacitor in logic die. A metal-insulator-metal (MIM) type capacitor may be formed as well.

Figure 6:
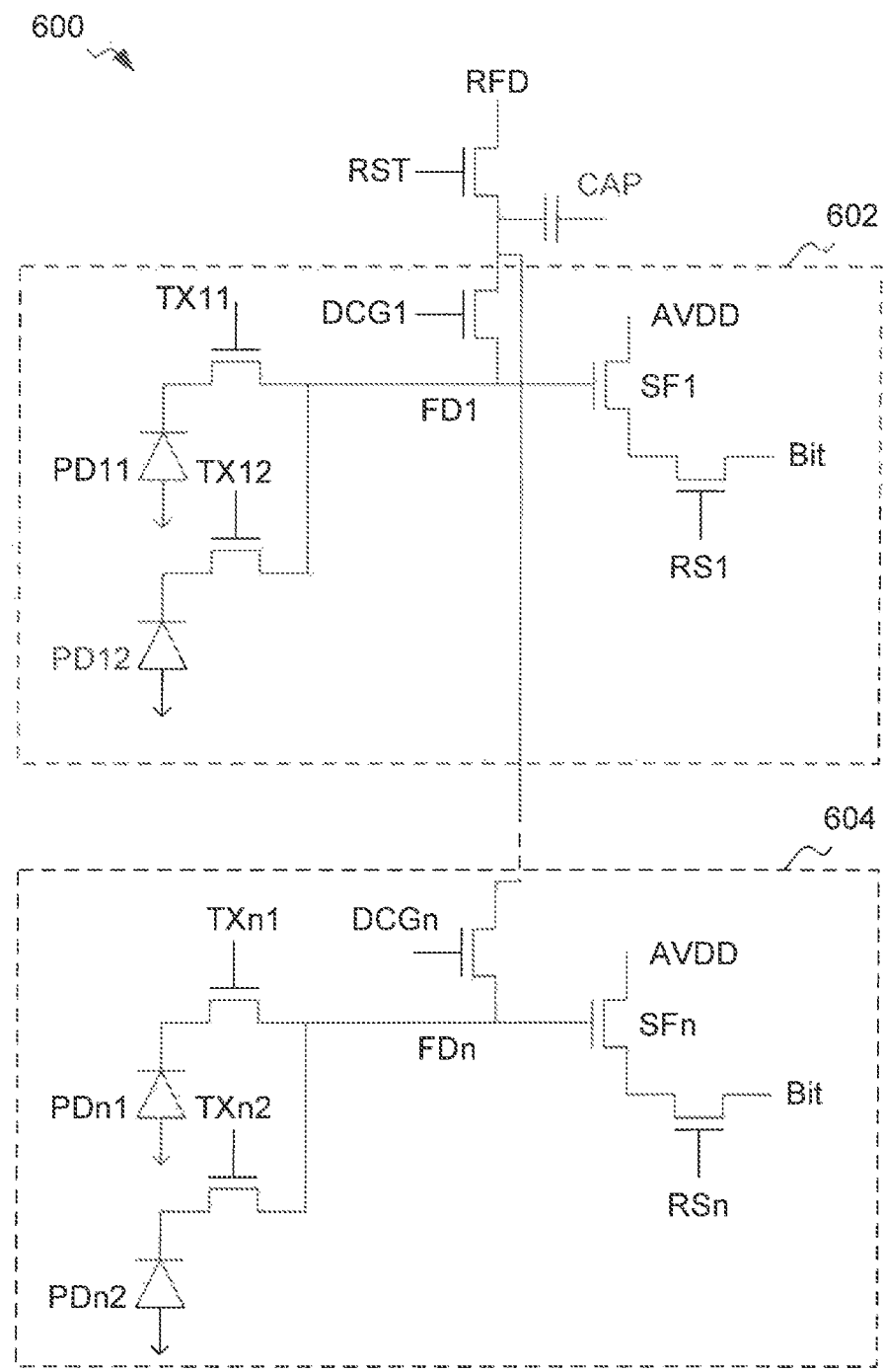
FIG. 6 shows a HDR group of N pairs of shared pixels, according to an embodiment of the invention.

FIG. 6 shows a HDR group of N pairs of shared pixels 600, according to an embodiment of the invention. N is an integer. N may be 2, 4, 8 or any suitable number. A pair of shared pixels is the same as 1×2 shared pixels. An image sensor, e.g., CMOS image sensor, may comprise a pixel array comprising a plurality of groups of N pairs of shared pixels 600. A first pair of shared pixels 602 comprises photodiodes PD11 and PD12 coupled to floating diffuser FD1 through transfer gates TX11 and TX12, respectively. A dual conversion gain transistor DCG1 is coupled to FD1. Charges in FD1 are converted to a voltage by a source follower transistor SF1. An output signal Bit of SF1 is readout by turning on a row select transistor RS1 coupled to the source of SF1. The drain of SF1 is coupled to analog power supply AVDD.

Similarly, a N-th pair of shared pixels 604 comprises photodiodes PDn1 and PDn2 coupled to floating diffuser FDn through transfer gates TXn1 and TXn2, respectively. A dual conversion gain transistor DCGn is coupled to FDn. Charges in FDn are converted to a voltage by a source follower transistor SFn. An output signal Bit of SFn is readout by turning on a row select transistor RSn coupled to the source of SFn. The drain of SFn is coupled to analog power supply AVDD.

A common capacitor CAP is coupled to floating diffusion of all pairs FD1-FDn through dual conversion gain transistors of all pairs DCG1-DCGn, respectively. A reset transistor RST is also coupled to floating diffusion of all pairs FD1-FDn through dual conversion gain transistors of all pairs DCG1-DCGn, respectively, to reset FD1-FDn to RFD voltage.

Figure 7:
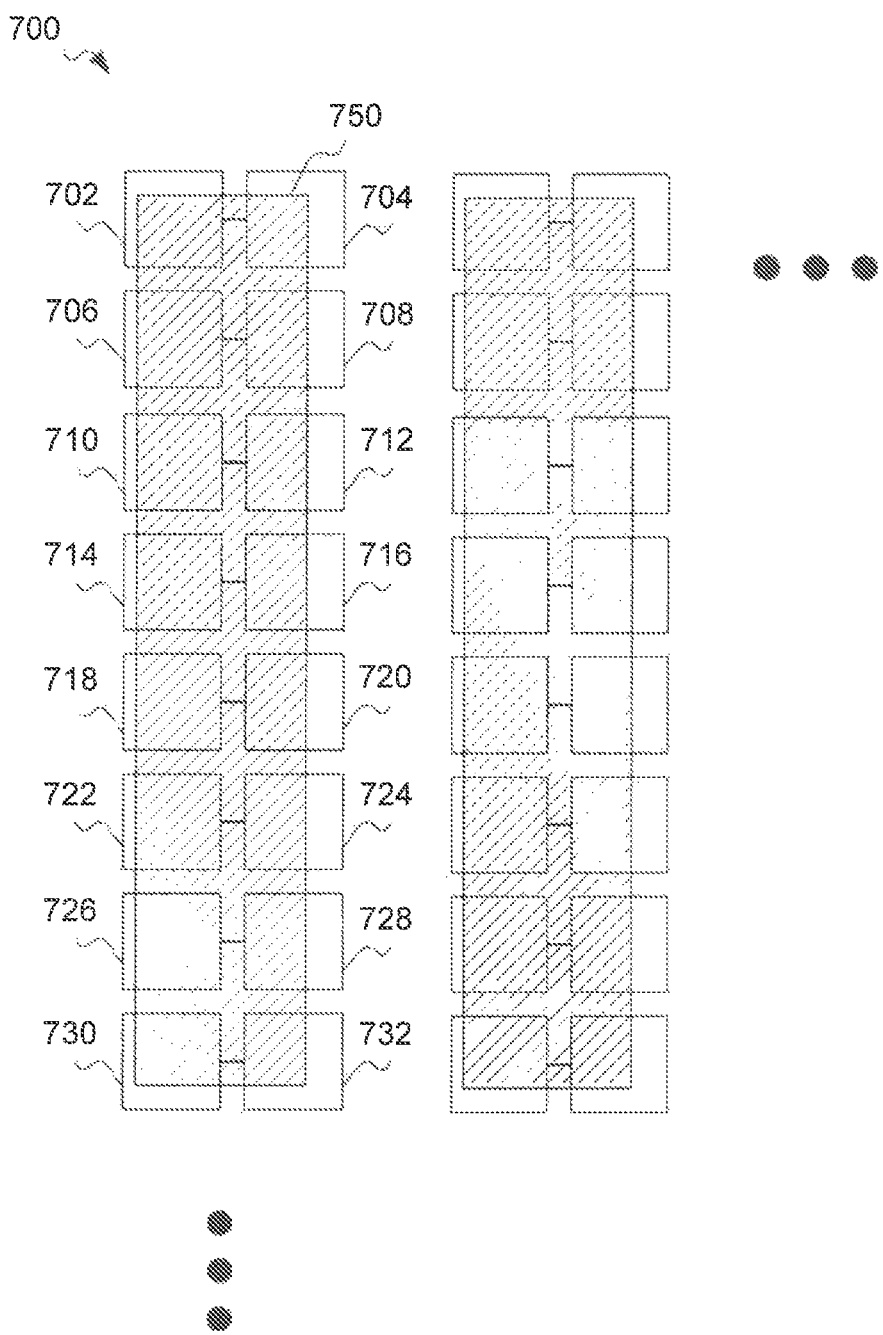
FIG. 7 shows an exemplary layout view of a pixel array of an image sensor comprising a plurality of groups of 8 pairs of shared pixels, according to an embodiment of the present invention.

FIG. 7 shows an exemplary layout view of a pixel array of an image sensor comprising a plurality of groups of N pairs of shared pixels 700, according to an embodiment of the present invention. Each group of N pairs of shared pixels comprises N pairs of shared pixels. Each pair of shared pixels comprises a first shared pixel and a second shared pixel. For example, FIG. 7 shows a pixel array including a group of 8 pairs of shared pixels. A first pair of shared pixels comprises a first shared pixel 702 and a second shared pixel 704. A second pair of shared pixels comprises a first shared pixel 706 and a second shared pixel 708. A third pair of shared pixels comprises a first shared pixel 710 and a second shared pixel 712. A fourth pair of shared pixels comprises a first shared pixel 714 and a second shared pixel 716. A fifth pair of shared pixels comprises a first shared pixel 718 and a second shared pixel 720. A sixth pair of shared pixels comprises a first shared pixel 722 and a second shared pixel 724. A seventh pair of shared pixels comprises a first shared pixel 726 and a second shared pixel 728. An eighth pair of shared pixels comprises a first shared pixel 730 and a second shared pixel 732. A common capacitor 750 is formed having an area covering part of or all shared pixels 702-732. The area may cover most of shared pixels 702-732. Common capacitor 750 may comprise two parallel planar electrodes and a dielectric layer formed therebetween forming a MIM type capacitor. Capacitor 750 may also comprise a planar electrode and another electrode in an oxide layer forming a MOM type capacitor. In an embodiment, a common capacitor may be formed on a separate logic die in a stacked die structure.

While the present invention has been described herein with respect to the exemplary embodiments and the best mode for practicing the invention, it will be apparent to one of ordinary skill in the art that many modifications, improvements and sub-combinations of the various embodiments, adaptations and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A group of shared pixels comprising:
   a first shared pixel comprising a first photodiode and a first transfer gate;
   a second shared pixel comprising a second photodiode and a second transfer gate;
   a third shared pixel comprising a third photodiode and a third transfer gate;
   a fourth shared pixel comprising a fourth photodiode and a fourth transfer gate;
   a first floating diffusion shared by the first shared pixel and the second shared pixel;
   a second floating diffusion shared by the third shared pixel and the fourth shared pixel;
   a capacitor coupled to the first floating diffusion through a first dual conversion gain transistor,
   and the second floating diffusion through a second dual conversion gain transistor;
   wherein the capacitor is formed having an area covering most of the first shared pixel, the second shared pixel, the third shared pixel, and the fourth shared pixel.

2. The group of shared pixels of claim 1, wherein the capacitor comprises one of, two parallel planar electrodes and a dielectric layer formed therebetween, and a planar electrode and another electrode in an oxide layer.

3. The group of shared pixels of claim 1 further comprising:
   a first source follower transistor coupled to a power supply from a drain and coupled to a first row select transistor from a source to convert charges in the first floating diffusion to voltage, wherein the first row select transistor outputs a read signal from the first source follower; and
   a second source follower transistor coupled to the power supply from a drain and coupled to a second row select transistor from a source to convert charges in the second floating diffusion to voltage, wherein the second row select transistor outputs the read signal from the source follower.

4. The group of shared pixels of claim 1 further comprising:
   a reset transistor to reset the first floating diffusion and the second diffusion to a reset floating diffusion (RDF) voltage.

5. A group of shared pixels comprising:
   N pairs of shared pixels, each pair of shared pixels comprising a first shared pixel and a second shared pixel;
   a first shared pixel comprising a first photodiode and a first transfer gate;
   a second shared pixel comprising a second photodiode and a second transfer gate;
   a floating diffusion shared by the first shared pixel and the second shared pixel;
   a dual conversion gain transistor coupled to the floating diffusion;
   a common capacitor coupled to the floating diffusion of each pair of shared pixels through the dual conversion gain transistor of each pair of shared pixels;
   wherein N is an integer;
   wherein the common capacitor is formed having an area covering most of the N pairs of shared pixels.

6. The group of shared pixels of claim 5, wherein the common capacitor comprises one of, two parallel planar electrodes and a dielectric layer formed therebetween, and a planar electrode and another electrode in an oxide layer.

7. The group of shared pixels of claim 5, wherein N is one of 2, 4, and 8.

8. The group of shared pixels of claim 5, wherein each pair of shared pixels further comprises:
   a source follower transistor coupled to a power supply from a drain and coupled to a row select transistor from a source to convert charges in the floating diffusion to voltage, wherein the row select transistor outputs a read signal from the source follower.

9. The group of shared pixels of claim 5 further comprising:
a reset transistor to reset the floating diffusion of each pair of shared pixels to a reset floating diffusion (RDF) voltage.

10. A group of shared pixels comprising:
N pairs of shared pixels, each pair of shared pixels comprising a first shared pixel and a second shared pixel;
a first shared pixel comprising a first photodiode and a first transfer gate;
a second shared pixel comprising a second photodiode and a second transfer gate;
a floating diffusion shared by the first shared pixel and the second shared pixel;
a dual conversion gain transistor coupled to the floating diffusion;
a common capacitor coupled to the floating diffusion of each pair of shared pixels through the dual conversion gain transistor of each pair of shared pixels;
wherein N is an integer;
wherein the common capacitor is formed on a separate logic die.

11. A CMOS image sensor comprising a pixel array, the pixel array comprising a plurality of group of shared pixels, each group of shared pixels comprising:
N pairs of shared pixels, each pair of shared pixels comprising a first shared pixel and a second shared pixel;
a first shared pixel comprising a first photodiode and a first transfer gate;
a second shared pixel comprising a second photodiode and a second transfer gate;
a floating diffusion shared by the first shared pixel and the second shared pixel;
a dual conversion gain transistor coupled to the floating diffusion;
a common capacitor coupled to the floating diffusion of each pair of shared pixels through the dual conversion gain transistor of each pair of shared pixels;
wherein N is an integer;
wherein the common capacitor is formed having an area covering most of the N pairs of shared pixels.

12. The CMOS image sensor of claim 11, wherein the common capacitor comprises one of, two parallel planar electrodes and a dielectric layer formed therebetween, and a planar electrode and another electrode in an oxide layer.

13. The CMOS image sensor of claim 11, wherein N is one of 2, 4, and 8.

14. The CMOS image sensor of claim 11, wherein each pair of shared pixels further comprises:
a source follower transistor coupled to a power supply from a drain and coupled to a row select transistor from a source to convert charges in the floating diffusion to voltage, wherein the row select transistor outputs a read signal from the source follower.

15. The CMOS image sensor of claim 11 further comprising:
a reset transistor to reset the floating diffusion of each pair of shared pixels to a reset floating diffusion (RDF) voltage.

16. A CMOS image sensor comprising a pixel array, the pixel array comprising a plurality of group of shared pixels, each group of shared pixels comprising:
N pairs of shared pixels, each pair of shared pixels comprising a first shared pixel and a second shared pixel;
a first shared pixel comprising a first photodiode and a first transfer gate;
a second shared pixel comprising a second photodiode and a second transfer gate;
a floating diffusion shared by the first shared pixel and the second shared pixel;
a dual conversion gain transistor coupled to the floating diffusion;
a common capacitor coupled to the floating diffusion of each pair of shared pixels through the dual conversion gain transistor of each pair of shared pixels;
wherein N is an integer;
wherein the common capacitor is formed on a separate logic die.

* * * * *